United States Patent [19]

Uehara et al.

[11] Patent Number: 4,730,900

[45] Date of Patent: Mar. 15, 1988

[54] PROJECTION OPTICAL APPARATUS

[75] Inventors: Makoto Uehara, Tokyo; Hideo Mizutani; Kiyoyuki Muramatsu, both of Yokohama; Takeshi Asami, Kawasaki; Akikazu Tanimoto, Yokohama, all of Japan

[73] Assignee: Nippon Kogaku K. K., Tokyo, Japan

[21] Appl. No.: 696,085

[22] Filed: Jan. 29, 1985

[30] Foreign Application Priority Data

Feb. 3, 1984 [JP] Japan .................................. 59-18887

[51] Int. Cl.[4] ......................... G02B 7/02; G02B 27/52; G01J 5/00
[52] U.S. Cl. .................................. 350/253; 350/409; 350/418; 374/132; 355/55
[58] Field of Search ........................ 350/253, 235–237, 350/409, 418, 419; 374/100, 120, 130, 132, 133, 141; 355/44, 55, 63, 64, 67, 83

[56] References Cited

U.S. PATENT DOCUMENTS

| | | | |
|---|---|---|---|
| 2,189,122 | 2/1940 | Andrews | 374/132 |
| 3,109,097 | 10/1963 | De Waard et al. | 374/130 |
| 3,368,078 | 2/1968 | Flint et al. | 350/409 |
| 3,498,695 | 3/1970 | Brouwer | 350/418 |
| 4,238,157 | 12/1980 | Stranch et al. | 355/55 |
| 4,331,388 | 5/1982 | McCrobie et al. | 350/419 |
| 4,433,923 | 2/1984 | Rascati et al. | 374/120 |
| 4,556,327 | 12/1985 | Kalil et al. | 374/120 |

FOREIGN PATENT DOCUMENTS 2121558A 12/1983 United Kingdom .

Primary Examiner—John K. Corbin
Assistant Examiner—Loha Ben
Attorney, Agent, or Firm—Shapiro and Shapiro

[57] ABSTRACT

A projection optical apparatus comprises illuminating means providing for an illuminating light beam, a projection optical system including optical elements disposed across the illuminating light beam and having an imaging plane, and detecting mean including temperature sensor means provided on at least one of the optical elements and producing an output corresponding to the temperature of the one optical element.

19 Claims, 5 Drawing Figures

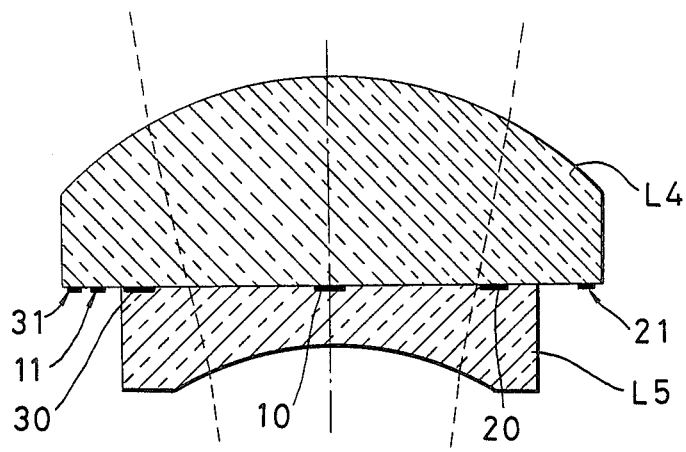
FIG. 2
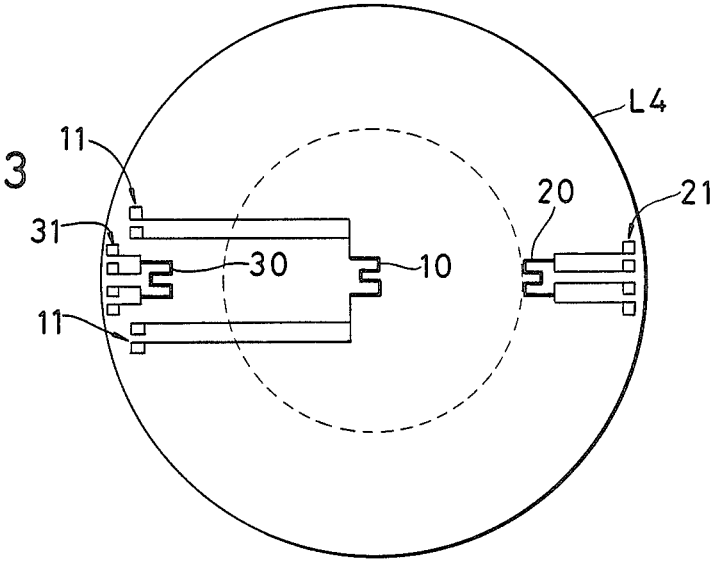
FIG. 3
FIG. 4
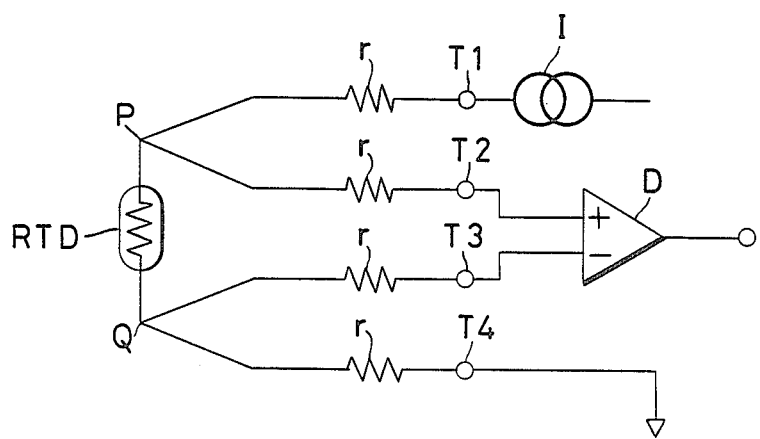

PROJECTION OPTICAL APPARATUS

BACKGROUND OF THE INVENTION

1. Field of the Invention

This invention relates to a projection exposure apparatus used for the manufacture of semiconductor integrated circuit elements, and particularly to an apparatus for detecting any variation in the optical performance of the projection optical system thereof.

2. Description of the Prior Art

Generally, the manufacturing process of integrated circuits such as IC and LSI is based on plural repetitions of resist application→alignment→exposure→development→etching effect for a wafer. In the collective exposure system wherein the pattern of a reticle is formed on a wafer in the relation of one to one, the error of alignment caused by deformation of the wafer occurring in the etching step or the like is great and coping with the minute patternization required of the exposure step is difficult. For this reason, the reduction projection exposure system has recently come to be used for the manufacture of highly integrated semiconductors. In the reduction projection exposure system, a plurality of exposed areas of the order of 10 mm–20 mm square are printed on a wafer of 4–6 inches by the step and repeat system and therefore, even for a deformed wafer, it is possible to maintain the alignment with the pattern of the preceding step at high accuracy during each exposure. Also, the projection lens for the reduction projection exposure system has N.A.=0.26–0.35 and uses g-line ($\lambda=436$ nm) or i-line ($\lambda=365$ nm) of short wavelength as the exposure light and therefore, even the so-called submicron printing of line width 1 $\mu$m or less is possible.

However, to accurately effect the repetition of the exposure of a minute pattern in the submicron area, it is necessary that the optical performance of the projection optical system itself be always in a stable and excellent state. The factors which cause the fluctuation of the optical performance of the projection optical system include environmental conditions such as temperature, humidity and atmospheric pressure, and the optical performance is also fluctuated by the optical elements themselves of the projection optical system absorbing the exposure energy and varying their own temperatures, and it has been found that such fluctuation is not negligible for making the patterns for super LSI more minute. As the variations in said optical performance, there are the variation in the imaging plane and the variation in the projection magnification. The variation in the imaging plane has a fatal adverse effect in a shallow depth of focus which is essentially unavoidable for a high resolving power, and the variation in the magnification adversely affects the accuracy of superposition printing. The projection optical system absorbs the applied energy for exposure and accumulates it as heat energy and therefore, the variation characteristic of its optical performance fluctuates depending on the manner of application of the exposure light, i.e., the application history. Where the application history is constant, the amount of fluctuation of the optical performance corresponding to the exposed state can be known by empirically measuring the variation characteristic of the optical performance in advance and it is possible to provide correcting means necessary for the correction thereof. Generally, however, the time required for replacement or alignment of a wafer and a reticle is not always constant, and the application history may also be changed by an unforeseen situation and in such a case, it is no longer possible to know the varied state of the optical performance. Accordingly, even if there is some correcting means, it becomes impossible to know how and to what degree the correction must be effected and thus, it becomes impossible to maintain a desired optical performance.

Also, a technique of calculating the integrated value of exposure time from the application history and operating the amount of correction of the optical performance on the basis of this value is known from British Laid-open patent application No. 2,121,558, etc., but the fluctuation of the optical performance is caused not only by the exposure history but also by the variations in the transmission factor of the reticle and the brightness of the light source and therefore, detecting means is required for each fluctuation element and the construction becomes complicated and also, a measurement error is caused for each detecting means, and this has led to a disadvantage that it is difficult to accurately know the fluctuation of the optical performance.

SUMMARY OF THE INVENTION

It is an object of the present invention to provide a projection exposure apparatus which enables highly accurate lithography of more minute patterns.

It is another object of the present invention to provide a detecting device which is capable of directly and simply detecting the optical performance of a projection optical system fluctuated by absorbing exposure energy and varying its temperature, irrespective of the exposed state.

According to the present invention, there is provided an apparatus in which temperatue sensors are fixed to one of lenses forming the projection optical system and any variation in the optical performance of the projection optical system is detected from the outputs of these temperature sensors.

Also, according to the present invention, there is provided an apparatus for measuring a temperature distribution, more specifically, a temperature gradient substantially rotation-symmetrical with respect to the optic axis caused by the optical elements in the optical path of the projection optical system absorbing exposure energy, on the basis of the close relation between the temperature distribution of the optical elements in the projection optical system and the optical performances such as the imaging plane and magnification of the projection optical system, thereby detecting the amount of fluctuation of the optical performances or the value corresponding thereto. In a preferred embodiment of the present invention, a plurality of thermometer elements are provided on a selected optical element in the projection optical system at different distances from the optical axis.

Generally, when a light beam enters a lens, the lens itself absorbs the incident energy and rises in temperature, and the temperature distribution condition in this case is substantially rotation-symmetrical and the portion on the optical axis of the lens becomes highest in temperature and the marginal edge portion of the lens becomes lowest in temperature. Accordingly, a temperature gradient occurs radially of the lens. This temperature gradient generally becomes great where the heat conduction from the lens surface to the air is small, and becomes small where the heat conduction to the air is great. The barrel member for supporting the circumference of the lens is not directly irradiated with the light beam and the environmental temperature of the projection exposure apparatus is generally kept constant and therefore, the temperature of the barrel member is maintained at a predetermined level and accordingly, the temperature of the marginal edge of the lens can be considered to be always constant.

By the occurrence of such a radial temperature gradient in the lens, fluctuations of the optical performances such as fluctuation of magnification and fluctuation of imaging plane occur in this lens. As regards the amount represented by the temperature gradient, if the temperature difference $\Delta t$ between the portion on the optical axis of the lens and the marginal edge of the lens is used, the amount of magnification fluctuation $\Delta y$ and the amount of imaging plane fluctuation $\Delta z$ in this lens depend on the temperature gradient $\Delta t$ and can be expressed as functions of $\Delta t$. On the other hand, the variation in the physical properties (refractive index, dispersion, etc.) of the lens material and the variation in the shape of the lens by the temperature gradient can be theoretically found and further, the amount of magnification variation and the amount of imaging plane variation can be theoretically found from these. Also, the variations in the optical performances such as magnification and imaging plane can be empirically found from the temperature gradient.

Thus, as regards a projection objective lens used in the projection exposure apparatus, in the projection objective lens comprising a combination of a plurality of lenses, the respective lenses create their inherent temperature gradients upon application of exposure light, and the amount of magnification fluctuation $\Delta Y$ and the amount of imaging plane fluctuation $\Delta Z$ of the entire lens system occur as the sum of the amounts of magnification fluctuation $\Delta y_i$ and the sum of the amounts of imaging plane fluctuation $\Delta z_i$, respectively, of the respective lenses. Accordingly, $\Delta Y$ and $\Delta Z$ can be expressed as:

$$\Delta Y = \sum_i \Delta y_i(\Delta t_i) \tag{1}$$

$$\Delta Z = \sum_i \Delta z_i(\Delta t_i) \tag{2}$$

where $\Delta t_i$ represents the temperature gradient in each lens.

Generally, the projection objective lens is used at the magnification, the numerical aperture and the numerical field inherent thereto, and the state in which a light beam passes through the lens system when application of exposure light is effected is constant and therefore, the temperature gradients in some of the lenses in the lens system and the temperature gradient in each of the remaining lenses primarily correspond to each other. Therefore, by measuring the temperature gradients in said some lenses, the amounts of fluctuation of the optical performances such as the amount of magnification fluctuation and the amount of imaging plane fluctuation of the entire system can be known. That is, assuming that a temperature gradient $\Delta t_1$ occurs in a particular optical element in the optical path of the projection optical system and thereby a magnification variation $\Delta y_1$ and an imaging plane variation $\Delta z_1$ are caused in this optical element, the aforementioned equations (1) and (2) may respectively be expressed as $$\Delta Y = \Delta y_1(\Delta t_1) + \sum_{i=2} \Delta y_i(\Delta t_i) \tag{3}$$

$$\Delta Z = \Delta z_1(\Delta t_1) + \sum_{i=2} \Delta z_i(\Delta t_i) \tag{4}$$

and by measuring only $\Delta t_1$, it is possible to know the amount of magnification fluctuation $\Delta Y$ of the entire system and the amount of imaging plane fluctuation $\Delta Z$ of the entire system.

Now, each element itself of the projection optical system absorbs the applied energy of exposure light and creates a temperature gradient, whereby the optical performances are varied, but it is considered that in a state in which the temperature rise of each optical element by the absorption of the applied energy is saturated, the temperature gradient is constant and as long as the saturated state continues, the fluctuations of the optical performances by the applied energy do not occur. Accordingly, it is during the time until each optical element absorbs the applied energy and reaches the saturated state of temperature rise immediately after the application of exposure light has been started that the present invention as described above is most required. During this time, the temperature distribution varies with the lapse of time and the optical performances vary from moment to moment and therefore, it is necessary to detect the fluctuations of the optical performances on real time like the present invention and correspondingly provide appropriate correcting means. This also holds true not only at the start of the operation of the projection optical apparatus, but also when exposure is resumed after the temporary interruption of the application of exposure light such as replacement and alignment of a wafer and a reticle. It has been confirmed that the time constant which provides the index of the variation characteristic of the temperature gradient (temperature distribution until the temperature rise of the optical elements reaches the saturated state is substantially equal to the time constant of the fluctuation of magnification or imaging plane and therefore, it is easy to keep correspondence between the varied state of the temperature gradient and the fluctuated state of magnification or imaging plane and thus, it is possible to easily accomplish the correction by real time control.

BRIEF DESCRIPTION OF THE DRAWINGS

FIG. 2 is a cross-sectional view showing the constructions of the lenses L4 and L5 of the projection lens system and resistance thermometer devices.

FIG. 3 is a bottom plan view of the lens L4.

FIG. 4 diagrammatically shows a temperature measuring circuit using a resistance thermometer device.

DETAILED DESCRIPTION OF THE PREFERRED EMBODIMENTS

Figure 1:
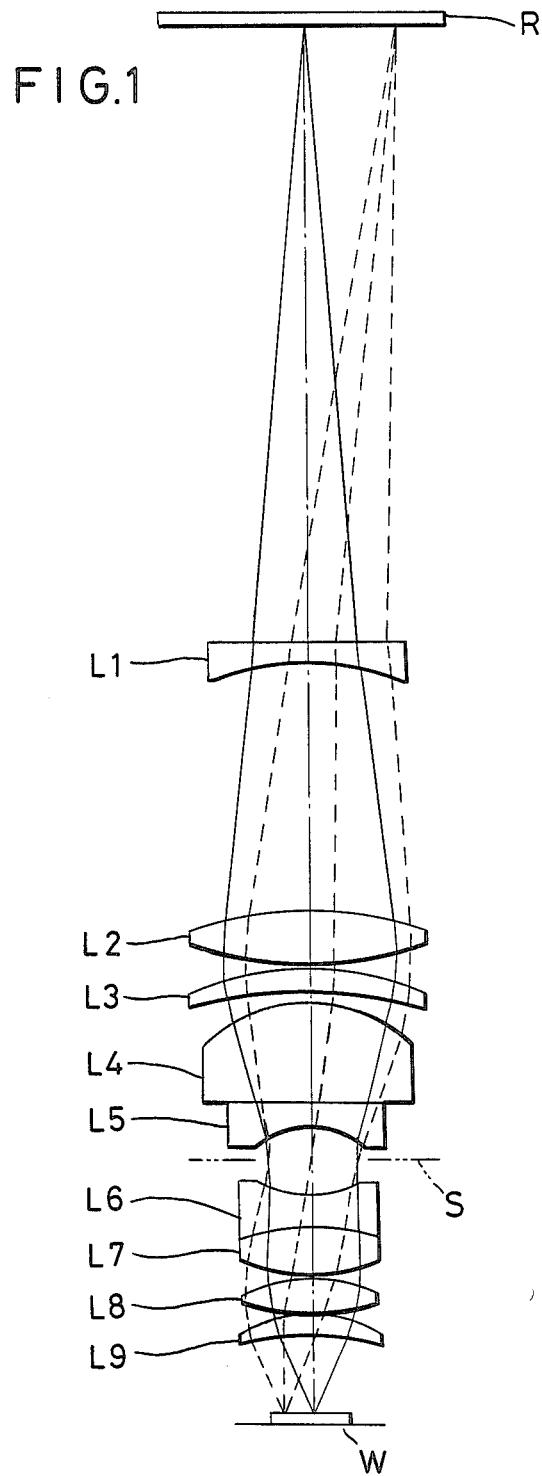
FIG. 1 schematically shows the optical path of a projection lens system used in an embodiment of the present invention.

The present invention will hereinafter be described with respect to embodiments thereof shown in the drawings.

In FIG. 1, there is shown an embodiment of the projection lens used in a projection exposure apparatus. A predetermined pattern formed on a reticle R is projected on a reduced scale on a wafer W by a projection lens system having nine lenses L1–L9. The positive fourth lens L4 and the negative fifth lens L5 are cemented together in their planar surface, and on this cemented surface, resistance thermometer devices (RTD's) 10, 20 and 30 are provided at three locations lying at different distances from the optic axis, as shown in FIGS. 2 and 3. Each RTD is formed into a thin film by evaporating a metal such as aluminum, platinum or chromium on the surface of the lens and has an electrical resistance value variable correspondingly to a temperature change. Electrical terminal groups 11, 21 and 31 are connected to the RTD's 10, 20 and 30, respectively.

The cemented surface of the fourth lens L4 and the fifth lens L5 is substantially near the position of the aperture stop S of the projection lens system, as can be seen in FIG. 1. The position of the aperture stop S is generally defined as the position at which the principal ray of an oblique light beam intersects the optical axis, and it is a position at which the passage areas of the light beam from the on-axis object point and the light beam from the off-axis object point substantially overlap each other, whereby the temperature gradient created in the lens surface near the position of the aperture stop becomes greatest and therefore, measurement is easy to do, and this position is suited to represent the temperature gradient of the entire lens system. Moreover, the position of the aperture stop is farthest from the conjugate relation with the pattern surface of the reticle and therefore, the temperature distribution is not deviated from a rotation-symmetrical state with respect to the optical axis by the usually asymmetrical pattern on the reticle, and the position of the aperture stop reflects the most average temperature distribution of the entire projection lens system. Also, where the RTD's are disposed in the passage area of the exposure light, they partly intercept the light beam though slightly and thus are liable to adversely affect the imaging performance, but where the RTD's are provided near the position of the aperture stop, the influence upon the imaging performance can be minimized.

The terminal groups 11, 21 and 31 of the RTD's 10, 20 and 30 are connected to the temperature measuring circuit of FIG. 4 which effects resistance measurement by the so-called four-line type wiring method. Two lead wires are led out from each of the opposite ends P and Q of each RTD and are connected to four terminals T1, T2, T3 and T4, and a constant current source I is connected to the first terminal T1 so that a constant current is supplied to the fourth terminal T4 through the RTD. Any voltage drop in the RTD is detected by a differential amplifier D connected between the second terminal T2 and the third terminal T3. By making the input impedance of the differential amplifier D sufficiently high, the current passing through the terminal T2, the RTD and the terminal T3 can be neglected and the influence of the wiring resistor r of each lead wire can also be neglected. As a result, it is possible to very accurately measure the resistance value across the RTD. It is necessary that the current supplied from the constant current source I be not very great in order to make the amount of heat generated by the RTD itself small.

Of the three RTD's, the first RTD 10 is disposed on the optical axis, the second RTD 20 is disposed immediately outside the passage area of the exposure light beam indicated by broken lines, and the third RTD 30 is disposed on the marginal edge of the lens L5. The actual condition of the temperature distribution can be approximately known by measuring the temperatures at these three points.

However, temperature measurement need not always be effected at the three points as described above, but approximate temperature distribution can also be known by the temperature measurement at any two of the three points and therefore, temperature measurement may be effected at the two points lying at radially different distances from the optical axis. Particularly, the temperature at the marginal edge of the lens and the temperature of a barrel member for holding the lens can be regarded as being substantially identical to each other and therefore, by providing a discrete sensor for measuring the temperature of the barrel member, the temperature distribution condition can be detected even by the measurement only at one point on the lens surface.

Generally, the temperature change of a lens is greatest at the one-axis position of the lens and the temperature measurement at the on-axis position is most advantageous for the determination of the temperature distribution condition. However, the RTD formed of a thin metal film reflects or absorbs a light beam and therefore, if the RTD lies on the optical axis, it may sometimes hinder the adjustment of the optical axis during the manufacture and regulation of the lens and thus, it is practical to provide the RTD at a position somewhat deviated from the optical axis. Also, where the RTD is provided in the passage area of the light beam, the RTD itself may absorb the applied energy and rise in temperature, and therefore, if for example, like the second RTD 20 and the third RTD 30 shown in FIGS. 2 and 3, RTD's are provided only outside the passage area of the light beam, it will be possible to eliminate the error caused by the RTD itself absorbing the applied energy.

On the other hand, the RTD which is formed into a thin film is small in mass and accordingly small in heat capacity and therefore, if the application of the exposure light is stopped, the temperature rise resulting from the absorption of the applied energy in the RTD itself will disappear in a short time. Accordingly, where the RTD is provided in the passage area of the light beam, if temperature measurement is effected after the lapse of a predetermined time after the application of the exposure light has been stopped, the error caused by the RTD itself absorbing the applied energy and rising in temperature can be eliminated. In this case, it is desirable that the time from after the application of the exposure light has been stopped until temperature measurement is started be longer than the time required for the temperature rise of the RTD itself caused by the absorption of the applied energy to disappear substantially and be such a degree of time that the temperature distribution of the lens itself does not change greatly.

The disposition of the temperature sensors on the cemented surface between the fourth lens L4 and the fifth lens L5 as in the above-described example is less subject to the influence of the cooling effect by air and enables the temperature distribution in the lens to be detected more faithfully. Where the temperature sensors are disposed on the surface of the lens which is in contact with air, it is desirable to provide a protective film on the RTD's. selection of the material of this protective film, it is possible to reduce the absorption of the exposure light into the RTD's. Further, it is effective to measure the temperature distribution in the lens also in the direction of the optical axis in order to accomplish more precise measurement of the optical performance fluctuation.

The temperature gradient in the lens near the aperture stop can be detected by the temperature measuring circuit using the RTD's as described above and correspondingly thereto, the amounts of fluctuation of the optical performances such as magnification and imaging plane can be theoretically or empirically known. Accordingly, upon detection of the temperature, the necessary corrections of magnification and imaging plane in that state can be effected, and stabilization of the optical performances can be achieved on real time irrespective of the application history. There will hereinafter be described of an example of the projection exposure apparatus in which the corrections of magnification and imaging plane are effected on the basis of the above-described temperature gradient detection.

Figure 5:
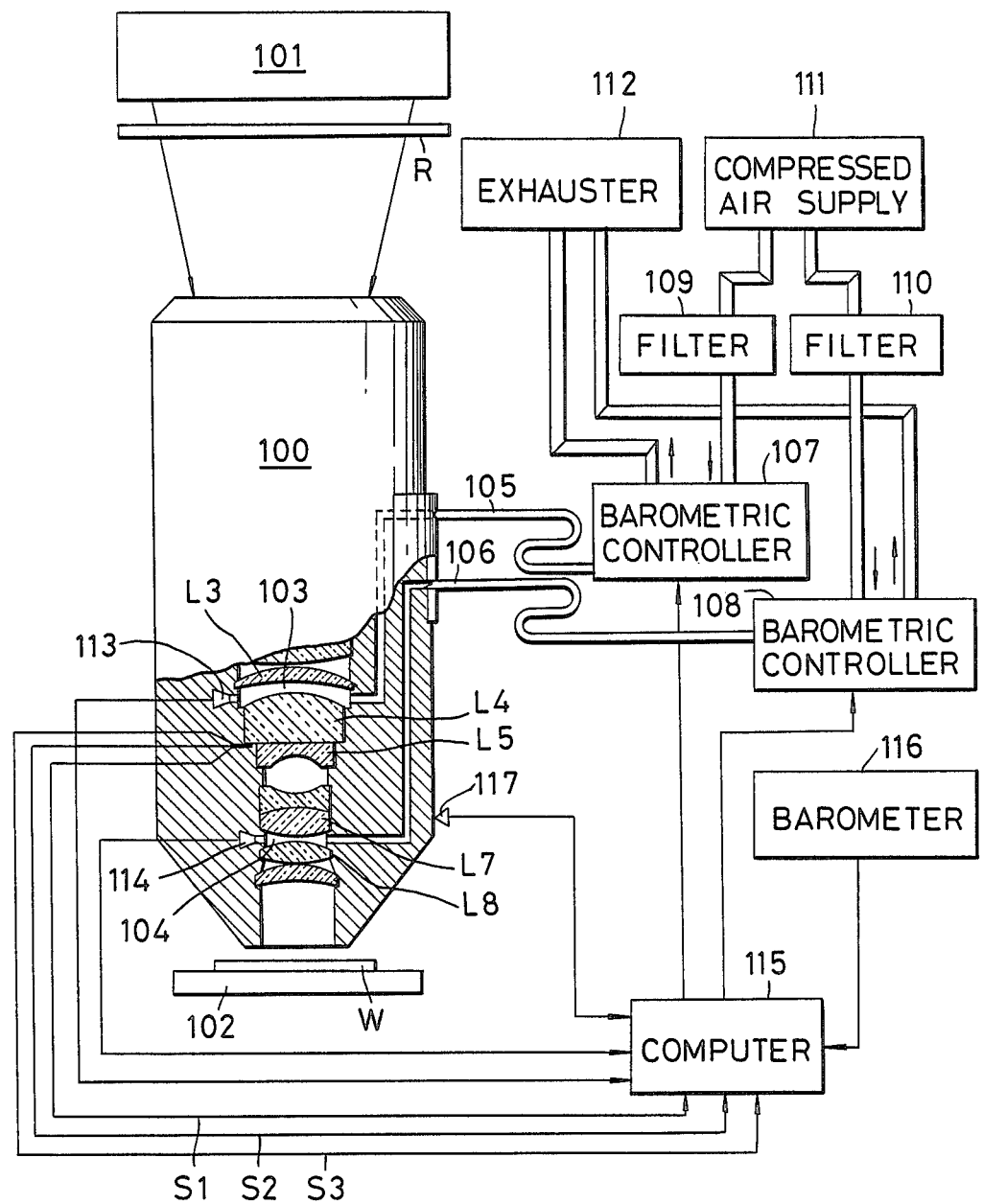
FIG. 5 shows an example of the construction of a projection exposure optical apparatus.

A projection lens unit 100 shown in FIG. 5 is provided with the lens system of FIG. 1. The spaces between the lenses L3 and L4 and between the lenses L7 and L8 are independent of the atmosphere, and the pressures in these spaces are controlled in accordance with the information of the temperature gradient. Thereby, the optical performances such as the projection magnification and imaging plane of the projection lens system are adjusted. The projection lens unit 100 reduction-projects the pattern on the reticle R uniformly illuminated by an illuminating device 101 onto a wafer W placed on a stage 102. Two independent air chambers 103 and 104 are connected to barometric controllers 107 and 108, respectively, provided outside the lens unit, by pipes 105 and 106, respectively. Air under a predetermined pressure is steadily supplied to the barometric controllers from a compressed air supply device 111 through filters 109 and 110 and is exhausted by an exhauster 112 as required. On one side of each air chamber, there is provided a pressure sensor 113, 114 for detecting the pressures in the air chambers, and the output signals of these pressure sensors are supplied to a computer 115. The method of correcting or finely adjusting the optical performances by isolating particular air spaces in such a projection lens system from the atmosphere and controlling the pressures therein is described in detail in U.S. application Ser. No. 632,335 filed on July 19, 1984.

Signals S1, S2 and S3 corresponding to the temperatures at the respective points detected by the three RTD's 10, 20 and 30 are input to the computer 115, which thus detects the temperature gradient $\Delta t_1$ on the cemented surface between the fourth lens L4 and the fifth lens L5. The computer determines the amount of magnification fluctuation $\Delta Y$ and the amount of imaging plane fluctuation $\Delta Z$ in the entire lens system on the basis of the aforementioned equations (3) and (4), and calculates the amounts of variation in the pressures in the air chambers 103 and 104 necessary to correct said amounts of fluctuation. Signals indicative of the amounts of variation in the pressures necessary for the correction are put out to the barometric controllers 107 and 108, which thus vary the pressures in the air chambers 103 and 104 by amounts corresponding to these signals. By such a construction, the optical performances of the lens elements in the projection lens unit are corrected on the real time control basis.

In this reduction projection type exposure apparatus, any fluctuation of the environmental conditions such as the atmospheric pressure can be detected by a barometer 116 to correct the optical performances even for the fluctuation of the environmental conditions. Also, it is desirable to measure the temperature of the housing of the projection lens unit by a temperature sensor 117 and effect the correction of the optical performances with the temperature change of the housing additionally taken into account.

The computer can detect the temperature gradient by the use of the difference between the temperatures at any two of the three points at which the temperatures are detected by the three RTD's. Thus, if the temperature gradient is detected by the second RTD 20 and the third RTD 30 provided outside the passage area of the exposure light, the error caused by the RTD itself absorbing the applied energy and rising in temperature can be eliminated.

What is claimed is:

1. An optical imaging apparatus for forming on a substrate an image of an object, comprising:
   means for holding said object,
   means for holding said substrate;
   means for supplying a light beam to illuminate said object;
   a projection optical system provided between said object and said substrate and having an optical axis and optical elements arranged on said optical axis, wherein said projection optical system receives light from the illuminated object and forms an image therefrom on the substrate, and wherein the optical performance of said projection optical system varies as a function of the manner in which the received light heats said projection optical system;
   means for detecting the temperature distribution of one of said optical elements in a direction radial to said optical axis;
   means for determining the variation of said optical performance of said projection optical system in response to the detected temperature distribution; and
   means for adjusting said image of said object on said substrate in accordance with the determined variation of said optical performance.

2. An apparatus according to claim 1, wherein said detecting means includes a plurality of thermometer elements provided on said one optical element at different distances from said optical axis.

3. An apparatus according to claim 2, wherein said detecting means further includes means for producing a plurality of corresponding outputs from said plurality of thermometer elements and detects said temperature distribution in response to said plurality of outputs.

4. An apparatus according to claim 2, wherein said projection optical forms an optical path for light received from said object and passed to said substrate, and said plurality of thermometer elements include a first element and a second element provided inside and outside said optical path, respectively, on said one optical element.

5. An apparatus according to claim 2, wherein said projection optical system forms an optical path for light received from said object and passed to said said substrate, and said plurality of thermometer elements include a first element and a second element both provided outside said optical path on said one optical element.

6. An apparatus according to claim 1, wherein said one optical element is disposed near an aperture stop of said projection optical system.

7. An apparatus according to claim 1, wherein said adjusting means includes means for forming at least one air space in said projection optical system that extends across said optical axis and that is independent of an environment outside said projection optical system and means for controlling the pressure in said air space.

8. An apparatus according to claim 7, wherein said optical elements are lens elements and said air space is provided between two lens elements disposed adjacent to each other.

9. An optical imaging apparatus for forming on a substrate an image of an object, comprising:
- means for holding said object;
- means for holding said substrate;
- means for supplying a light beam to illuminate said object;
- a projection optical system provided between said object and said substrate and having an optical axis and optical elements arranged on said optical axis, wherein said projection optical system receives light from the illuminated object and forms an image therefrom on the substrate, and wherein the optical performance of said projection optical system varies as a function of the manner in which the received light heats said projection optical system;
- means for detecting the temperature distribution of one of said optical elements in a direction radial to said optical axis; and
- means for adjusting said image of said object on said substrate in response to the detected temperature distribution.

10. An optical imaging apparatus for forming on a substrate an image of an object, comprising:
- means for holding said object;
- means for holding said substrate;
- means for supplying a light beam to illuminate said object;
- a projection optical system provided between said object and said substrate and having an optical axis and optical elements arranged on said optical axis, wherein said projection optical system receives light from the illuminated object and forms an image therefrom on the substrate, and wherein the optical performance of said projection optical system varies as a function of the manner in which the received light heats said projection optical system;
- a plurality of thermometer elements provided on a surface of one of said optical elements at different distances from said optical axis and producing a plurality of corresponding outputs; and
- means for detecting the temperature distribution of said one optical element in a direction radial to said optical axis in response to said plurality of outputs of said thermometer elements to determine the variation of said optical performance of said projection optical system in response to the detected temperature distribution.

11. An apparatus according to claim 10, wherein said one optical element is disposed near an aperture stop of said projection optical system.

12. An apparatus according to claim 11, wherein said optical elements include another optical element having a surface contacting said surface of said one optical element, said plurality of thermometer elements being disposed between said one optical element and said another optical element.

13. An optical imaging apparatus for forming on a substrate an image of an object, comprising:
- means for holding said object;
- means for holding said substrate;
- means for supplying a light beam to illuminate said object;
- a projection optical system provided between said object and said substrate and having an optical axis and lens elements arranged on said optical axis, said lens elements including a first lens elements and a second lens element having a surface contacting a surface of said first lens element, wherein said projection optical system receives light from the illuminated object and forms an image therefrom on the substrate, and wherein the optical performance of said projection optical system varies as a function of the manner in which the received light heats said projection optical system;
- a plurality of thermometer elements provided between said surface of said first lens element and said surface of said second lens elements at different distances from said optical axis and producing a plurality of corresponding outputs;
- means for detecting the temperature distribution of said first and second lens elements in a direction radial to said optical axis to determine the variation of said optical performance of said projection optical system in response to the detected temperature distribution; and
- means for adjusting said image of said object on said substrate in accordance with the determined variation of said optical performance.

14. An apparatus according to claim 13, wherein said first and second lens elements are disposed near an aperture stop of said projection optical system.

15. An optical imaging apparatus for forming on a substrate an image of an object, comprising:
- means for holding said object;
- means for holding said substrate;
- means for supplying a light beam to illuminate said object;
- a projection optical system provided between said object and said substrate and having an optical axis and optical elements arranged on said optical axis, wherein said projection optical system receives light from the illuminated object and forms an image therefrom on the substrate, and wherein the optical performance of said projection optical system varies as a function of the manner in which the received light heats said projection optical system;
- a plurality of thermometer elements provided on a surface of one of said optical elements at different distances from said optical axis and producing a plurality of corresponding outputs; and
- means for determining the variation of said optical performance of said projection optical system in response to said plurality of outputs of said thermometer elements.

16. An apparatus according to claim 15, further comprising means for adjusting said image of said object on said substrate in accordance with the determined variation of said optical performance.

17. An apparatus according to claim 15, wherein said one optical element is disposed near an aperture stop of said projection optical system.

18. An optical imaging apparatus for forming on a substrate an image of an object, comprising:
- means for holding said object;
- means for holding said substrate;

means for supplying a light beam to illuminate said object;

a projection optical system provided between said object and said substrate and having an optical axis and optical elements arranged on said optical axis, wherein said projection optical system receives light from the illuminated object and forms an image therefrom on the substrate, and wherein the optical performance of said projection optical system varies as a function of the manner in which the received light heats said projection optical system;

a plurality of thermometer elements provided near an aperture stop of said projection optical system at different distances from said optical axis and producing a plurality of corresponding outputs; and means for adjusting said image of said object on said substrate in response to said plurality of outputs of said thermometer elements.

19. An apparatus according to claim 18, wherein said plurality of thermometer elements are provided on a surface of one of said optical elements.

* * * * *